(12) United States Patent
Benoit et al.

(10) Patent No.: US 9,059,196 B2
(45) Date of Patent: Jun. 16, 2015

(54) BIPOLAR JUNCTION TRANSISTORS WITH SELF-ALIGNED TERMINALS

(71) Applicant: International Business Machines Corporation, Armonk, NY (US)

(72) Inventors: John J. Benoit, Williston, VT (US); James R. Elliot, Richmond, VT (US); Peter B. Gray, Jericho, VT (US); Alvin J. Joseph, Williston, VT (US); Qizhi Liu, Lexington, MA (US); Christa R. Willets, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/070,989

(22) Filed: Nov. 4, 2013

(65) Prior Publication Data

US 2015/0123245 A1    May 7, 2015

(51) Int. Cl.
   *H01L 21/762*    (2006.01)
   *H01L 29/73*     (2006.01)
   (Continued)

(52) U.S. Cl.
   CPC ........ *H01L 29/66272* (2013.01); *H01L 29/732* (2013.01)

(58) Field of Classification Search
   CPC ............... H01L 29/66242; H01L 29/1004; H01L 29/732; H01L 29/0821; H01L 29/73; H01L 29/66234; H01L 21/8249; H01L 29/7317; H01L 29/737
   USPC .......... 257/565, E21.371, 197, E29.044, 257/E29.174, E21.37, E21.696, E21.372; 438/318, 205, 313, 340, 235
   See application file for complete search history.

(56) References Cited

U.S. PATENT DOCUMENTS 5,506,427 A    4/1996  Imai
5,525,817 A    6/1996  Hill et al.
(Continued)

FOREIGN PATENT DOCUMENTS

CN    103180956A A    6/2013

OTHER PUBLICATIONS

"A super self-aligned selectively grown SiGe base (SSSB) bipolar transistor fabricated by cold-wall type UHV/CVD technology" Sato, F.; Tatsumi, T.; Hashimoto, T.; Tashiro, T. Electron Devices, IEEE Transactions on vol. 41, Issue: 8, Publication Year: 1994, pp. 1373-1378.

(Continued)

*Primary Examiner* — David Vu
*Assistant Examiner* — Jonathan Han
(74) *Attorney, Agent, or Firm* — Wood, Herron & Evans, LLP; Anthony J. Canale

(57) ABSTRACT

Device structures, design structures, and fabrication methods for a bipolar junction transistor. A first layer comprised of a first semiconductor material and a second layer comprised of a second semiconductor material are disposed on a substrate containing a first terminal of the bipolar junction transistor. The second layer is disposed on the first layer and a patterned etch mask is formed on the second layer. A trench extends through the pattern hardmask layer, the first layer, and the second layer and into the substrate. The trench defines a section of the first layer stacked with a section of the second layer. A selective etching process is used to narrow the section of the second layer relative to the section of the first layer to define a second terminal and to widen a portion of the trench in the substrate to undercut the section of the first layer.

11 Claims, 8 Drawing Sheets

(51) Int. Cl.
*H01L 29/66* (2006.01)
*H01L 29/732* (2006.01)

(56) References Cited

U.S. PATENT DOCUMENTS

| | | | |
|---|---|---|---|
| 5,625,206 | A | 4/1997 | Chandrasekhar et al. |
| 5,729,033 | A | 3/1998 | Hafizi |
| 5,962,880 | A | 10/1999 | Oda et al. |
| 7,002,190 | B1 | 2/2006 | Geiss et al. |
| 7,777,255 | B2 | 8/2010 | Rucker et al. |
| 2005/0054172 | A1* | 3/2005 | Feng et al. .................... 438/313 |
| 2005/0079678 | A1* | 4/2005 | Verma et al. .................. 438/312 |
| 2005/0085044 | A1 | 4/2005 | Hulsmann |
| 2007/0126080 | A1* | 6/2007 | Wallner et al. ................ 257/565 |
| 2007/0298578 | A1* | 12/2007 | Khater et al. .................. 438/322 |
| 2013/0069160 | A1 | 3/2013 | Aquilino et al. |

OTHER PUBLICATIONS

State Intellectual Property Office of the P.R. China, Written Opinion of the International Searching Authority issued in International Application No. PCT/CN2014/088399 dated Jan. 6, 2015.

State Intellectual Property Office of the P.R. China, International Search Report issued in International Application No. PCT/CN2014/088399 dated Jan. 6, 2015.

\* cited by examiner

BIPOLAR JUNCTION TRANSISTORS WITH SELF-ALIGNED TERMINALS

BACKGROUND

The invention relates generally to semiconductor device and integrated circuit fabrication and, in particular, to fabrication methods, device structures, and design structures for a bipolar junction transistor.

Bipolar junction transistors may be utilized in integrated circuits designed for high-frequency applications and in integrated circuits designed for high-power applications such as power amplifiers. Generally, a bipolar junction transistor is comprised of three distinct semiconductor regions that define terminals, namely an emitter, a collector, and a base disposed between the emitter and collector. An NPN bipolar junction transistor includes a layer of p-type semiconductor material constituting the base and two layers of n-type semiconductor material constituting the emitter and collector. The layers of n-type semiconductor material are sandwiched between the two layers of n-type semiconductor material. The conductivity types of the semiconductor materials for the emitter, base and collector in a PNP bipolar junction transistor are reversed. Generally, the differing conductivity types of the emitter, base, and collector form a pair of p-n junctions, namely a collector-base junction and an emitter-base junction. A voltage applied across the emitter-base junction controls the movement of charge carriers between the collector and emitter.

Improved fabrication methods, device structures, and design structures are needed for a bipolar junction transistor.

SUMMARY

In an embodiment of the invention, a method is provided for fabricating a bipolar junction transistor. The method includes forming a first layer comprised of a first semiconductor material and disposed on substrate containing a first terminal (e.g., a collector), forming a second layer comprised of a second semiconductor material and disposed on the first layer, and forming a patterned hardmask layer on the second layer. A trench is formed that extends through the patterned hardmask layer, the first layer, and the second layer and into the substrate. The trench defines a section of the first layer and a section of the second layer stacked with the section of the first layer. The method further includes etching the substrate and the section of the second layer selective to the section of the first layer and the patterned hardmask layer so that the section of the second layer is narrowed relative to the section of the first layer to define a second terminal (e.g., an emitter) and a portion of the trench in the substrate is widened to undercut the section of the first layer.

In an embodiment of the invention, a device structure is provided for a bipolar junction transistor. The device structure includes a base layer comprised of a first semiconductor material and disposed on a substrate. The device structure includes a first terminal in the substrate and a second terminal comprised of a second semiconductor material. The first terminal is coextensive with the trench isolation region and the second terminal is disposed on the base layer. A trench isolation region extends into the substrate and laterally beneath the base layer so that a portion of the base layer overhangs the trench isolation region.

According to another embodiment of the present invention, a design structure is provided for a bipolar junction transistor that is readable by a machine used in design, manufacture, or simulation of an integrated circuit. The design structure includes a base layer comprised of a first semiconductor material and disposed on a substrate. The design structure includes a first terminal in the substrate and a second terminal comprised of a second semiconductor material. The first terminal is coextensive with the trench isolation region and the second terminal is disposed on the base layer. A trench isolation region extends into the substrate and laterally beneath the base layer so that a portion of the base layer overhangs the trench isolation region. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
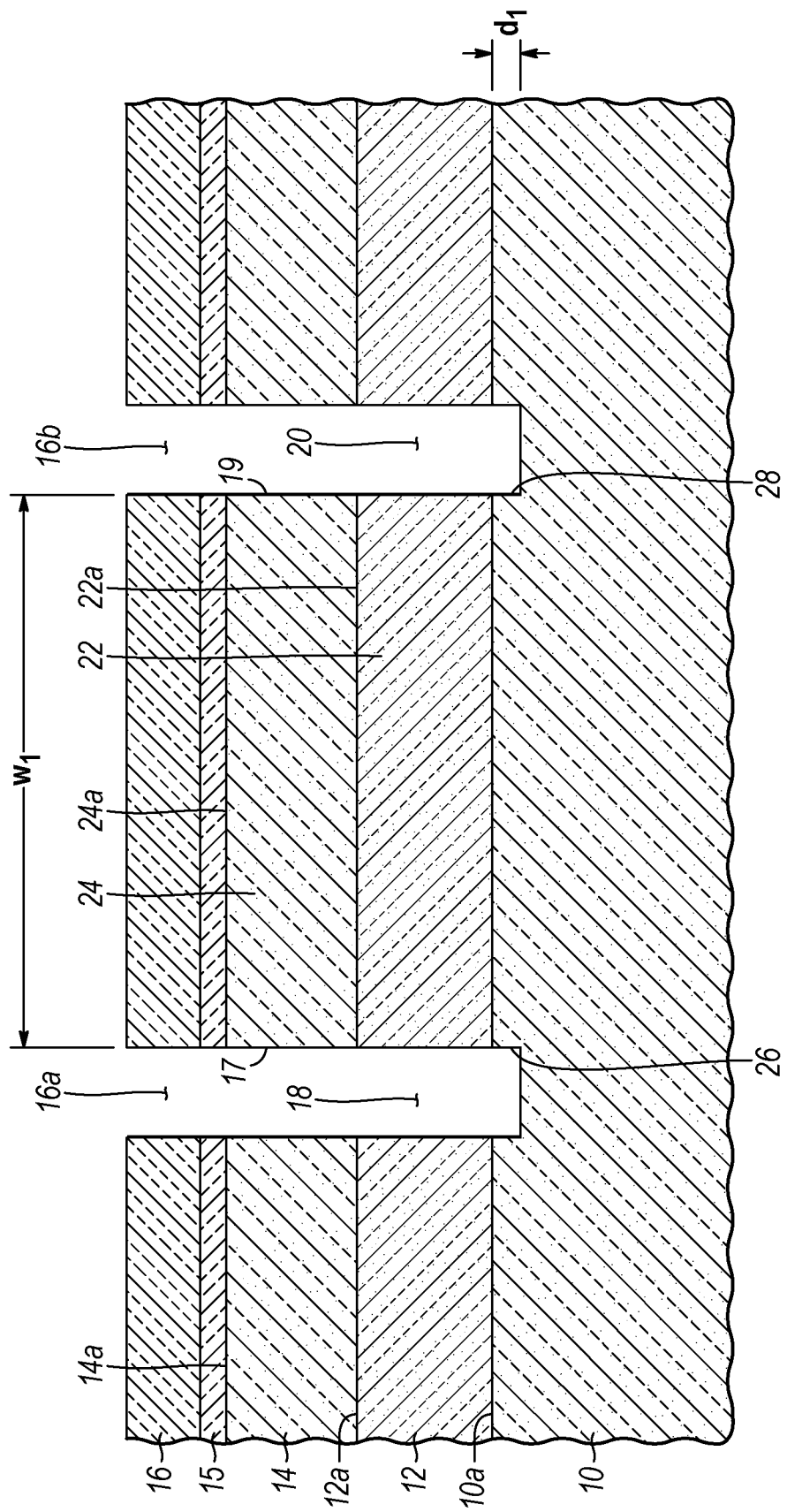
FIGS. 1-5 are cross-sectional views of a portion of a substrate at successive fabrication stages of a processing method for fabricating a device structure in accordance with an embodiment of the invention.

With reference to FIG. 1 and in accordance with an embodiment of the invention, a substrate 10 comprises a single-crystal semiconductor material usable to form the devices of an integrated circuit. For example, the substrate 10 may be comprised of a bulk wafer of a monocrystalline silicon-containing material, such as single-crystal silicon, or a device layer of a silicon-on-insulator wafer. The semiconductor material constituting the substrate 10 may comprise an electrically-active dopant that alters its electrical properties and may also include an optional epitaxial layer. The substrate 10 may comprise an n-type dopant from Group V of the Periodic Table (e.g., phosphorus (P), arsenic (As), or antimony (Sb)) in a concentration that is effective to impart n-type conductivity. For example, the substrate 10 may be implanted with ions comprised of the dopant and subsequently annealed to activate the dopant and alleviate implantation damage.

A base layer 12 is formed as a continuous additive film on the top surface 10a of substrate 10. The base layer 12 may be comprised of a semiconductor material, such as silicon-germanium (SiGe) in an alloy with a content of silicon (Si) ranging from 95 atomic percent to 50 atomic percent and a content of germanium (Ge) ranging from 5 atomic percent to 50 atomic percent. The germanium content of the base layer 12 may be uniform across the thickness of base layer 12 or graded and/or stepped across the thickness of base layer 12. If the germanium content is stepped, thicknesses of the base layer 12, such as respective thicknesses directly contacting the substrate 10 and adjacent to the top surface 12a, may lack germanium and may therefore be entirely comprised of silicon. The base layer 12 may comprise a dopant, such as a p-type dopant selected from Group III of the Periodic Table (e.g., boron) in a concentration that is effective to impart p-type conductivity and, optionally, carbon (C) to suppress the outdiffusion of the p-type dopant.

An emitter layer 14 is formed as a continuous additive film on the top surface 12a the base layer 12. The emitter layer 14 may be comprised of a different semiconductor material than base layer 12 and may have an opposite conductivity type from the base layer 12. For example, the emitter layer 14 may lack germanium that is present in at least a portion of the base layer 12. In a representative embodiment, the emitter layer 14 may be comprised of a semiconductor material, such as silicon, and may contain an n-type dopant in a concentration effective to impart n-type conductivity.

The base layer 12 and emitter layer 14 each have an epitaxial relationship with the substrate 10 and are grown using an epitaxial growth technique, such as vapor phase epitaxy. The crystal structure of the substrate 10 serves as a crystalline template for the growth of the crystal structure of the base layer 12. The crystal structure of the base layer 12 serves as a crystalline template for the growth of the crystal structure of the emitter layer 14.

A hardmask layer 15 comprised of a dielectric material, such as silicon dioxide ($SiO_2$), may be formed on a top surface 14a of emitter layer 14. A mask layer 16 may be applied on the top surface of the hardmask layer 15 and patterned with photolithography to define openings 16a, 16b. To that end, the mask layer 16 may comprise a light-sensitive material, such as a photoresist, that is applied as a coating by a spin coating process, pre-baked, exposed to light projected through a photomask, baked after exposure, and developed with a chemical developer to form an etch mask that features the openings 16a, 16b. The openings 16a, 16b in the mask layer 16 are extended into the hardmask layer 15 with an etching process having a suitable etch chemistry. The mask layer 16 may be removed after the hardmask layer 15 is patterned. If comprised of a photoresist, the mask layer 16 may be removed by ashing or solvent stripping, followed by a conventional cleaning process.

Trenches 18, 20 are defined that extend completely through the emitter layer 14, completely through the base layer 12, and to a shallow depth, $d_1$, into the substrate 10. The trenches 18, 20 are formed in alignment with the openings 16a, 16b in the hardmask layer 15. A section 22 of base layer 12 and a section 24 of emitter layer 14 are positioned between the sidewall 17 of trench 18 and the sidewall 19 of trench 20. The sidewalls 17, 19 of the trenches 18, 20 may be vertically oriented (i.e., aligned normal to the top surface 10a of the substrate). The sidewalls 17, 19 may be interconnected to surround the sections 22, 24 or, alternatively, the trenches 18, 20 may be parallel and lack any interconnection. Sidewall 17 may be separated from sidewall 19 by a distance equal to a width, $w_1$.

The etching process forming the trenches 18, 20 may comprise a wet chemical etching process or a dry etching process, such as reactive-ion etching (RIE). The etching process, which may be conducted in a single etching step or multiple steps, relies on one or more etch chemistries to etch the semiconductor materials of layers 12, 14 and substrate 10 while substantially not etching the dielectric material of the hardmask layer 15, and may comprise one or more timed etches. The hardmask 15 covers and preserves the sections 22, 24 during the etching process forming the trenches 18, 20.

Figure 2:
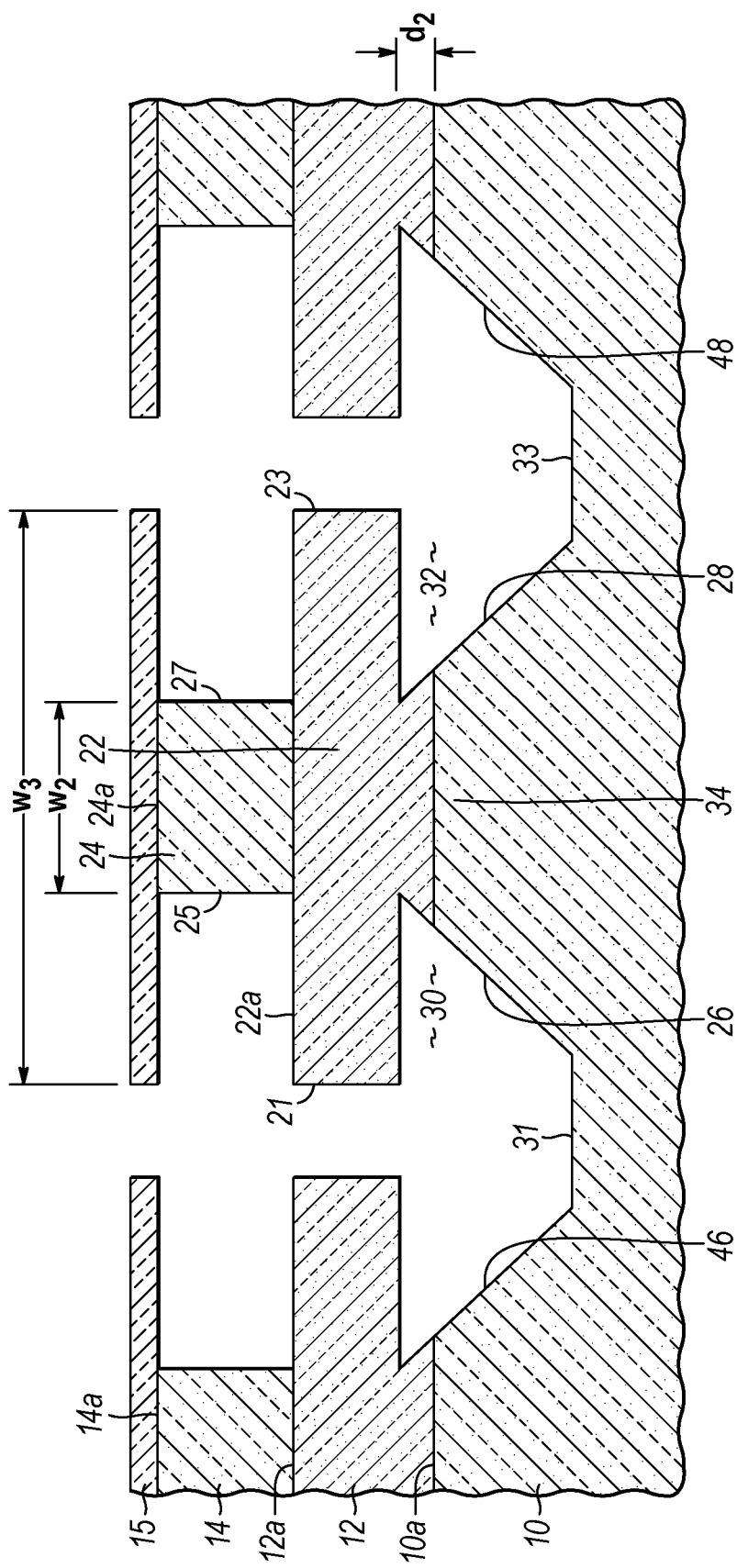

With reference to FIG. 2 in which like reference numerals refer to like features in FIG. 1 and at a subsequent fabrication stage of the processing method, cavities 30, 32 are defined in substrate 10 that undercut the base layer 12. The cavities 30, 32 are formed by increasing the depth and width of the portion of trenches 18, 20 in the substrate 10. Surfaces 26, 28, surfaces 32, 33, and surfaces 46, 48 are coextensive with the cavities 30, 32. In the representative embodiment, the surfaces 26, 28 and the surfaces 46, 48 are sloped or inclined at an angle relative to the top surface 10a. However, the surfaces 26, 28 and surfaces 46, 48 may have a different geometrical shape, such as a faceted shape or a planar shape. Surfaces 31, 33 are located at the base of the trenches 18, 20. Surface 31 connects surfaces 26, 46 and surface 33 connects surfaces 28, 48.

A collector 34 is laterally bounded in the substrate 10 between the surfaces 26, 28 of the cavities 30, 32. The collector 34 is comprised of the semiconductor material of the substrate 10, and may be selectively implanted with an impurity to further enhance its electrical conductivity. In one embodiment, the collector 34 may comprise n-type semiconductor material and may optionally be implanted with an n-type dopant to enhance its electrical conductivity relative to the bulk of the substrate 10.

The section 24 of emitter layer 14 is also narrowed when the cavities 30, 32 are defined in substrate 10 by widening and deepening the portion of the trenches 18, 20 in the substrate 10 because the emitter layer 14 is also undercut relative to the hardmask layer 15. The section 24 of emitter layer 14 includes sidewalls 25, 27 that are separated by a width $w_2$. The section 22 of base layer 12 includes side surfaces 21, 23 that are separated by a width, $w_3$, that is greater than the width $w_2$ of section 24. The surfaces 26, 28, which are coextensive with the collector 34, are separated by a varying distance that is less than or equal to $w_3$. In one embodiment, the width, $w_3$, of the section 22 of base layer 12 may be at least two times greater than the minimum separation between the surfaces 26, 28, and the width, $w_3$, of the section 22 of base layer 12 at least two times greater than the width $w_2$, of the section 24 of emitter layer 14. The surfaces 21, 23, which are depicted as vertical, may have a different geometrical shape, such as a faceted shape or an inclined shape.

To narrow the section 24 of emitter layer 14 and form the cavities 30, 32, the semiconductor materials of the emitter layer 14 and the substrate 10 may be etched by a wet chemical etching process, a dry etching process, or a combination of wet chemical and dry etching processes selective to the respective materials of the hardmask layer 15 and the base layer 12. The semiconductor materials of the substrate 10 and emitter layer 14 are etched selective to the materials of the base layer 12 and the hardmask layer 15. The selective etching may originate from the use of a composition-sensitive etchant that etches the semiconductor materials of emitter layer 14 and the substrate 10 at higher rates than the materials of the base layer 12 and hardmask layer 15. In an alternative embodiment, the etching process used to narrow the section 24 of emitter layer 14 may be different from the etching process used to form the cavities 30, 32. In the representative embodiment, a thin portion of the base layer 12 having a composition similar to the composition of the substrate 10 and bordering the cavities 30, 32 is removed over a thickness, $d_2$, by the etching process. The hardmask layer 15 may be removed after the section 24 of emitter layer 14 is narrowed and the cavities 30, 32 are formed.

The etching process may be controlled by selecting factors such as the etchant chemistry, duration, etc. Each etching process may be combined with implantation damage to the semiconductor material and/or impurity-doping of the semiconductor material to alter etch rates and, thereby, the profile of the cavities 30, 32 and the profile for the sidewalls 25, 27 of section 24. The etching process may further rely on wafer orientation and anisotropic etching processes that exhibit different etch rates for different crystallographic directions (as specified, for example, by Miller indices) in a single-crystal semiconductor material. In one embodiment, the vertical and lateral etch rates may be the same when the cavities 30, 32 are formed.

In an embodiment, the etching process may rely on orientation-dependent or anisotropic etching that exhibits different etch rates for different crystallographic directions (as specified, for example, by Miller indices) in a semiconductor material. As an example, if the substrate 10 and emitter layer 14 are comprised of silicon, then the anisotropic etching process may comprise a wet chemical etching process that uses an etchant comprising tetramethylammonium hydroxide (TMAH), ammonium hydroxide ($NH_4OH$), ethylenediamine pyrocatechol (EDP), or potassium hydroxide (KOH). To provide a substrate orientation suitable for an anisotropic etching process, before the mask layer 16 (FIG. 1) is patterned, the substrate 10 may be angularly oriented in the lithography tool used in the photolithography process using a feature on the substrate, such as a notch or flat at an outer edge, as an angular reference. The selection of a specific substrate orientation causes the openings 16a, 16b in the mask layer 16 to be oriented such that a crystal direction of the semiconductor material of substrate 10 is normal to the respective vertical sidewalls of the trenches 18, 20.

The section 24 of emitter layer 14 (i.e., the emitter in the completed device structure), the section 22 of base layer 12, and the cavities 30, 32 bounding the collector 34 are defined using a single mask layer 16 and hardmask layer 15. The terminals of the bipolar junction transistor are self-aligned relative to each other when formed using the hardmask layer 15. This process flow eliminates a mask normally used to define an emitter window in which an emitter is formed and may save multiple masks, which may reduce production costs by eliminating photolithography and etching processes. In addition, selective epitaxy is not required to grow the collector because the collector is defined in the substrate 10 when the cavities 30, 32 are etched, or to grow the base layer 12 because the base layer 12 is deposited non-selectively as a continuous layer and then etched to define section 22.

Figure 3:
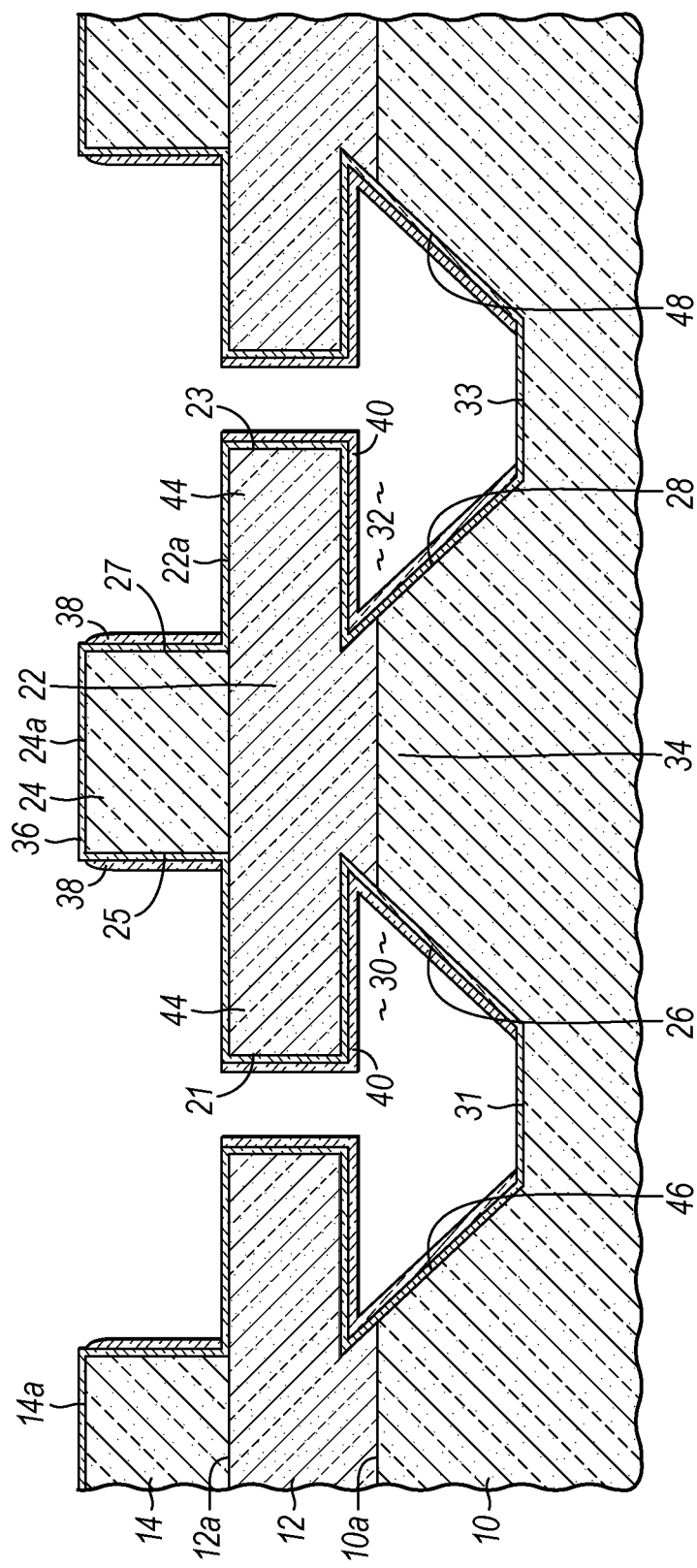

With reference to FIG. 3 in which like reference numerals refer to like features in FIG. 2 and at a subsequent fabrication stage of the processing method, a dielectric layer 36 is formed as a continuous film on the surfaces 26, 28, 31, 33 of substrate 10 bounding the cavities 30, 32, on the exposed surface of the section 24 of emitter layer 14, and on the surfaces of the section 22 of base layer 12 not covered by the section 24 from above and by the collector 34 from below. The dielectric layer 36 may be comprised of an electrical insulator with a dielectric constant (e.g., a permittivity) characteristic of a dielectric material. In one embodiment, the dielectric layer 36 may be comprised of a high temperature oxide (HTO) deposited using rapid thermal process (RTP) at temperatures of 500° C. or higher. Alternatively, the dielectric layer 36 may be comprised of oxide formed by a different deposition process, by thermal oxidation of silicon (e.g., oxidation at high pressure with steam (HIPOX)), or by a combination of these techniques.

A dielectric layer 40 is formed on the layer 36 and a directional anisotropic etching process, such as RIE, is used to preferentially remove the electrical insulator of dielectric layer 40 from horizontal surfaces, such as the surfaces 31, 33, selective to the dielectric material constituting dielectric layer 36. The dielectric layer 40 is retained on horizontal or partially horizontal surfaces, including surfaces 26, 28, that are hidden inside the cavities 30, 32. After etching, the dielectric layer 40 is discontinuous and includes spacers 38 formed on the sidewalls 25, 27 of the section 24 of emitter layer 14, sections on the sidewalls 21, 23 of the section 22 of base layer 12, and sections on the surfaces 26, 28 in the substrate 10 bordering the cavities 30, 32. Dielectric layer 40 may be comprised of an electrical insulator, such as $Si_3N_4$, that is conformally deposited by CVD. The selective removal of the dielectric layer 40 exposes the dielectric layer 36 on surfaces 31, 33, the top surface 24a of section 24 of emitter layer 14, and the top surface 22a of the section 22 of base layer 12 not covered by section 24.

Sections 44 of base layer 12, which overhang the cavities 30, 32 and the trench isolation regions subsequently formed in the cavities 30, 32, are not covered by the section 24 of emitter layer 14 and the spacers 38. These sections 44 of base layer 12 may be modified to increase their electrical conductivity by, for example, implanting the sections 44 with ions comprising a p-type dopant at a kinetic energy and dose selected to provide a concentration effective to impart p-type conductivity. A thermal anneal may be used to activate the dopant and alleviate implantation damage. These sections 44 of base layer 12 may define an extrinsic base in the device structure.

Figure 4:
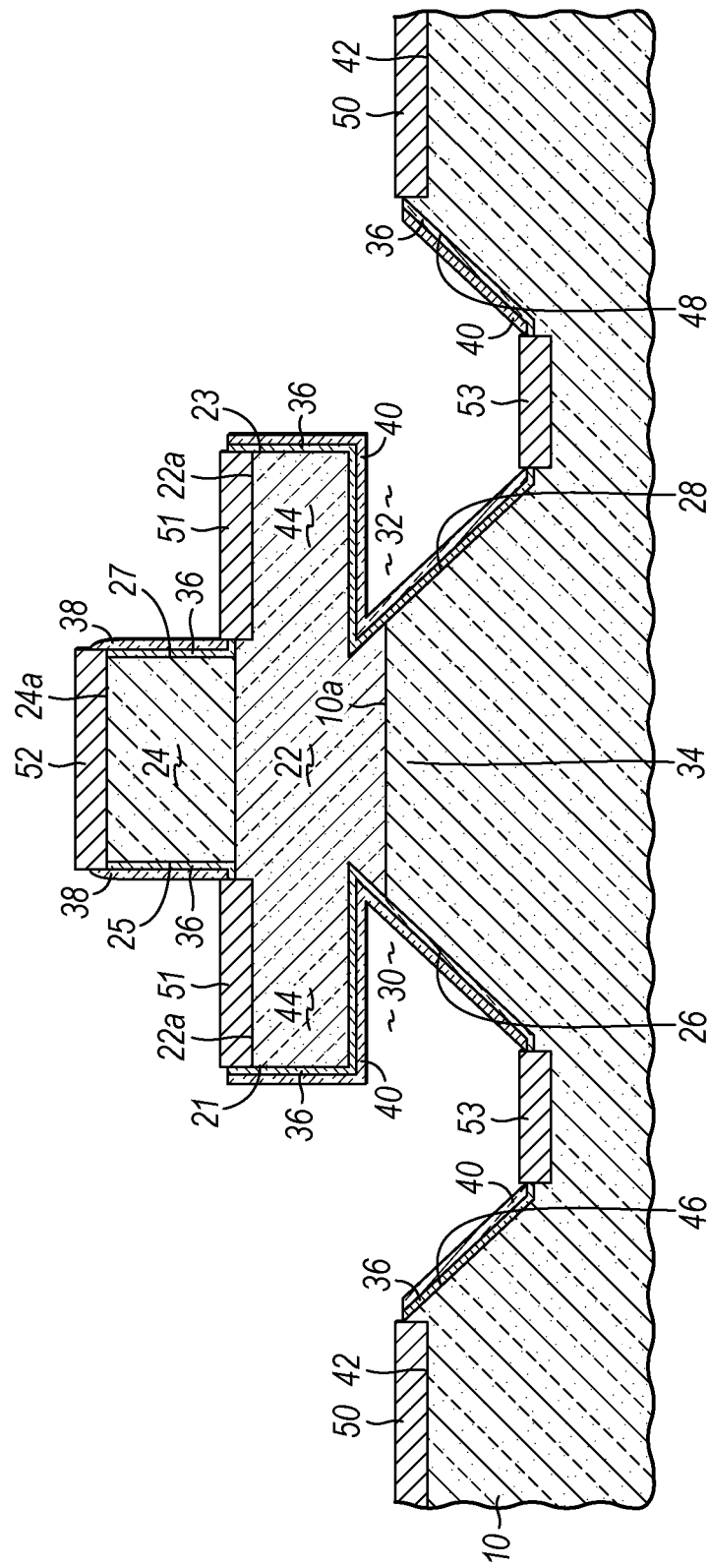

With reference to FIG. 4 in which like reference numerals refer to like features in FIG. 3 and at a subsequent fabrication stage of the processing method, one or more mask layers and one or more directional etching processes, such as RIE, are used to remove the field regions of layers 12, 14 while protecting section 22, section 24, and the surfaces 26, 28, 31, 33, 46, 48. The removal of the field regions of the base layer 12 and the emitter layer 14 opens a contact surface or area 42 on the substrate 10. The dielectric layer 36 is then removed from surfaces 31, 33, top surface 24a of the section 24 of emitter layer 14, and top surface 22a of the section 22 of base layer 12 not covered by section 24 and spacers 38. The spacers 38 and dielectric layer 40, which etch selective to dielectric layer 36, cover the surfaces 46, 48 between surfaces 31, 33 and the contact area 42, sidewalls 21, 23, sidewalls 25, 27, and surfaces 26, 28.

Sections 50 of a silicide layer are formed on contact area 42 and may be subsequently used in the process flow to contact the collector 34. Sections 51 of the silicide layer are formed on the top surface 22a of the section 22 of base layer 12 not covered by section 24 and may be subsequently used in the process flow to contact section 22. A section 52 of the silicide layer is formed on the top surface 24a of section 24 of emitter layer 14 and may be subsequently used in the process flow to contact section 24. Sections 53 of the silicide layer are formed on the surfaces 31, 33 inside the cavities 30, 32.

The sections 50-53 of the silicide layer may be formed by a silicidation process that involves one or more annealing steps to form a silicide phase by reacting a layer of silicide-forming metal and the semiconductor material contacting the silicide-forming metal. The layer of a silicide-forming metal is deposited by, for example, a CVD process or a physical vapor deposition (PVD) process. Candidate refractory metals for the silicide-forming metal include, but are not limited to, titanium (Ti), cobalt (Co), or nickel (Ni). A capping layer comprised of a metal nitride, such as sputter-deposited titanium nitride (TiN), may be applied to cap the silicide-forming metal.

An initial annealing step of the silicidation process may form a metal-rich silicide that consumes the silicide-forming metal and then form silicides of lower metal content that grow by consuming the metal-rich silicides. For example, the initial annealing step may be conducted by heating the silicide-forming metal utilizing rapid thermal annealing (RTA) at an annealing temperature, which may be contingent on the type of refractory metal, of about 400° C. to about 900° C. The silicide layer does not form on surfaces that are covered by the dielectric layer 40 and spacers 38, which promotes self-alignment of the silicide layer and the sectioning.

Following the initial annealing step, any non-converted silicide-forming metal and the optional capping layer may be removed with, for example, one or more wet chemical etches. The sections 50-53 of silicide may then be subjected to an additional annealing step to form a lower-resistance silicide phase. The annealing temperature of the additional annealing step may be greater than the annealing temperature of the initial annealing step.

Figure 5:
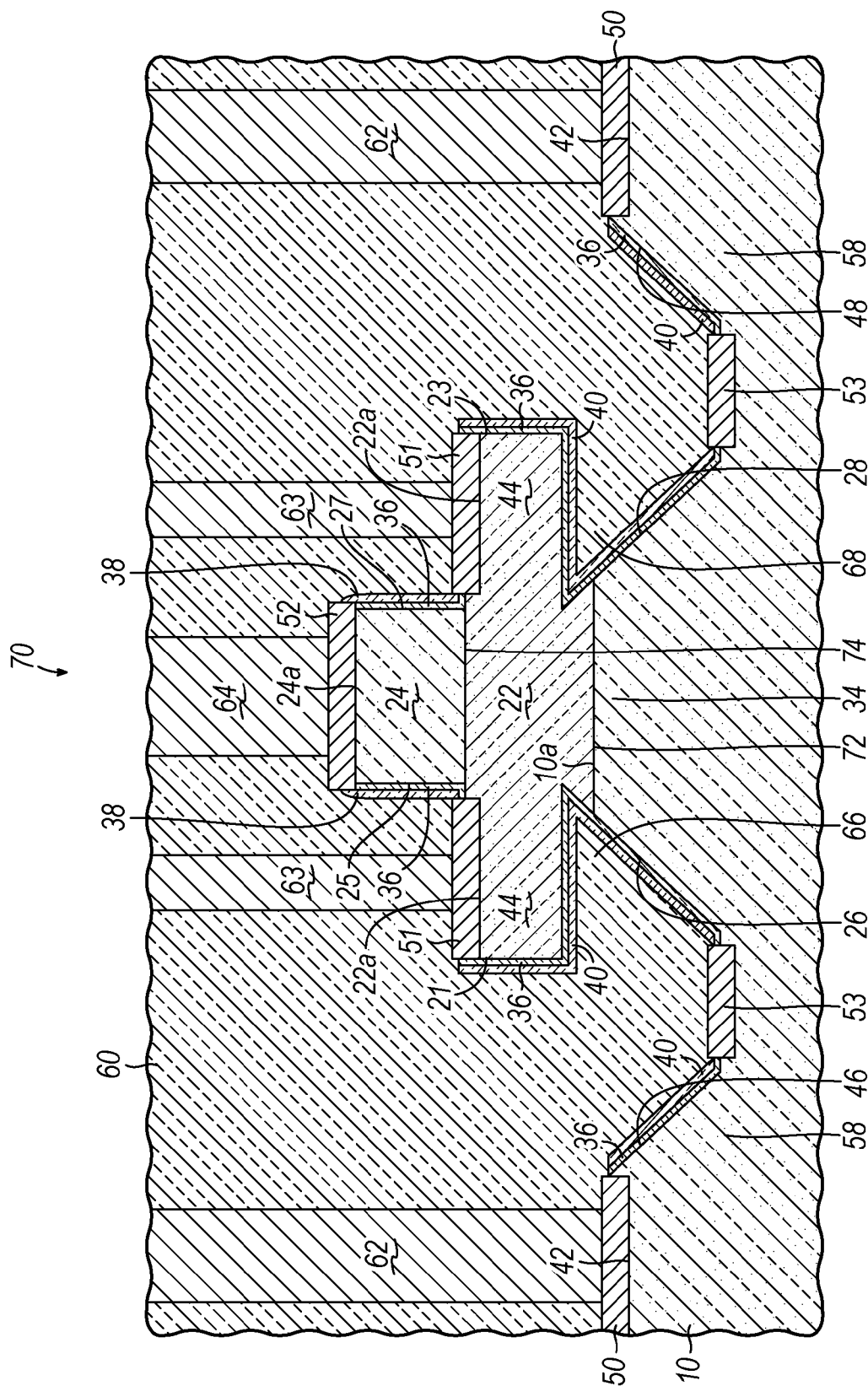

With reference to FIG. 5 in which like reference numerals refer to like features in FIG. 4 and at a subsequent fabrication stage of the processing method, middle-end-of-line (MEOL) processing, which includes formation of a dielectric layer 60, contacts 62, 63, 64, and wiring, follows to define a local interconnect structure. Candidate inorganic dielectric materials for the dielectric layer 60 may include, but are not limited to, borophosphosilicate glass (BPSG), silicon dioxide ($SiO_2$), silicon nitride ($Si_3N_4$), fluorine-doped silicon glass (FSG), and combinations of these and other dielectric materials. Dielectric layer 60 may be deposited by any number of techniques including, but not limited to, sputtering, spin-on application, or CVD.

Portions of the dielectric layer 60 may at least partially fill the cavities 30, 32 to define trench isolation regions 66, 68 that laterally flank the collector 34. The trench isolation regions 66, 68 will have dimensions and locations that reproduce the dimensions, geometrical shape, and locations of cavities 30, 32. As a result, the sections 44 of the base layer 14 overhang the trench isolation regions 66, 68.

A sub-collector 58, which is comprised of a doped region of the semiconductor material of substrate 10, extends laterally from the sub-collector 58 beneath the trench isolation regions 66, 68. The sub-collector 58 couples the collector 34 with the sections 50 of the silicide layer and the contacts 62. The sub-collector 58 may be formed by implanting the substrate 10 with ions of an impurity before an epitaxial layer is formed on the substrate 10. The semiconductor material of the sub-collector 58 has the same conductivity type as the semiconductor material of the collector 34.

The resulting device structure is a bipolar junction transistor 70 characterized by a vertical architecture that includes the collector 34, an intrinsic base defined by the portion of section 22 of base layer 12 between the emitter and collector 34, and an emitter defined by the section 24 of emitter layer 14. The section 24 of base layer 12 functioning as the intrinsic base is coextensive with the collector 34 along a junction 72. The section 24 of emitter layer 14 functioning as the emitter is coextensive with the section 24 of base layer 12 along a junction 74. Sections 44 of base layer 12 that are peripheral to the section 24 of base layer 12 may define an extrinsic base that is directly coupled with the intrinsic base. The bipolar junction transistor 70 may be characterized as a heterojunction bipolar transistor (HBT) if two or all three of the emitter, the collector 34, and the intrinsic base are comprised of different semiconductor materials.

In an alternative embodiment, the function and identity of the emitter and the collector as terminals may be exchanged to provide a collector-up configuration for the bipolar junction transistor 70 rather than the emitter-up configuration. In a collector-up configuration, the collector 34 would operate as an emitter and the section 24 of emitter layer 14 would function as a collector. In addition, the sub-collector 58 would function as a sub-emitter that couples the emitter with the contact area 42.

Contacts 62 extend through the dielectric layer 60 to contact the sections 50 of silicide layer and, thereby, to be coupled with the collector 34 of bipolar junction transistor 70. Contacts 63 extend through the dielectric layer 60 to contact the sections 51 of silicide layer and, thereby, to be coupled with the sections 44 of base layer 12 (i.e., the extrinsic base of bipolar junction transistor 70). Contacts 64 extend through the dielectric layer 60 to contact the section 52 of silicide layer and, thereby, to be coupled with the section 24 of emitter layer 14 (i.e., the emitter of bipolar junction transistor 70).

In an alternative embodiment, the sections 53 of silicide layer may be used to contact the collector 34, instead of sections 50, by displacing the contacts 62 laterally to intersect sections 53. Otherwise, these sections 53 of the silicide layer may be non-functional and merely buried in the dielectric layer 60.

During the front-end-of-line (FEOL) portion of the fabrication process, the device structure of the bipolar junction transistor 70 is replicated across at least a portion of the surface area of the substrate 10. In BiCMOS integrated circuits, complementary metal-oxide-semiconductor (CMOS) transistors may be formed using other regions of the substrate 10. As a result, both bipolar and CMOS transistors may be available on the same substrate 10. Standard back-end-of-line (BEOL) processing follows, which includes formation of dielectric layers, via plugs, and wiring for an interconnect structure coupled by the local interconnect structure with the bipolar junction transistor 70, as well as other similar contacts for additional device structures like bipolar junction transistor 70 and CMOS transistors included in other circuitry fabricated on the substrate 10.

The emitter, intrinsic base, and collector (i.e., the terminals) of the bipolar junction transistor 70 are self-aligned, which may provide high performance, and are formed by a series of photolithography and etch events in the different stages of the process flow. The self-alignment of these three terminals is done with use of a single mask, which contrasts with the multiple masks required in existing constructions for a vertical bipolar junction transistor. The width of the emitter (i.e., section 24 of the emitter layer 14) is established by lithography and etching, which may be used to fashion a comparatively wide emitter for power amplifier applications. The base layer 12 can be made comparatively thick, which may also be beneficial for power amplifier applications. The dimensions of the base layer 12, the emitter layer 14, and the collector 34 are independently controllable in the device construction.

Figure 6:
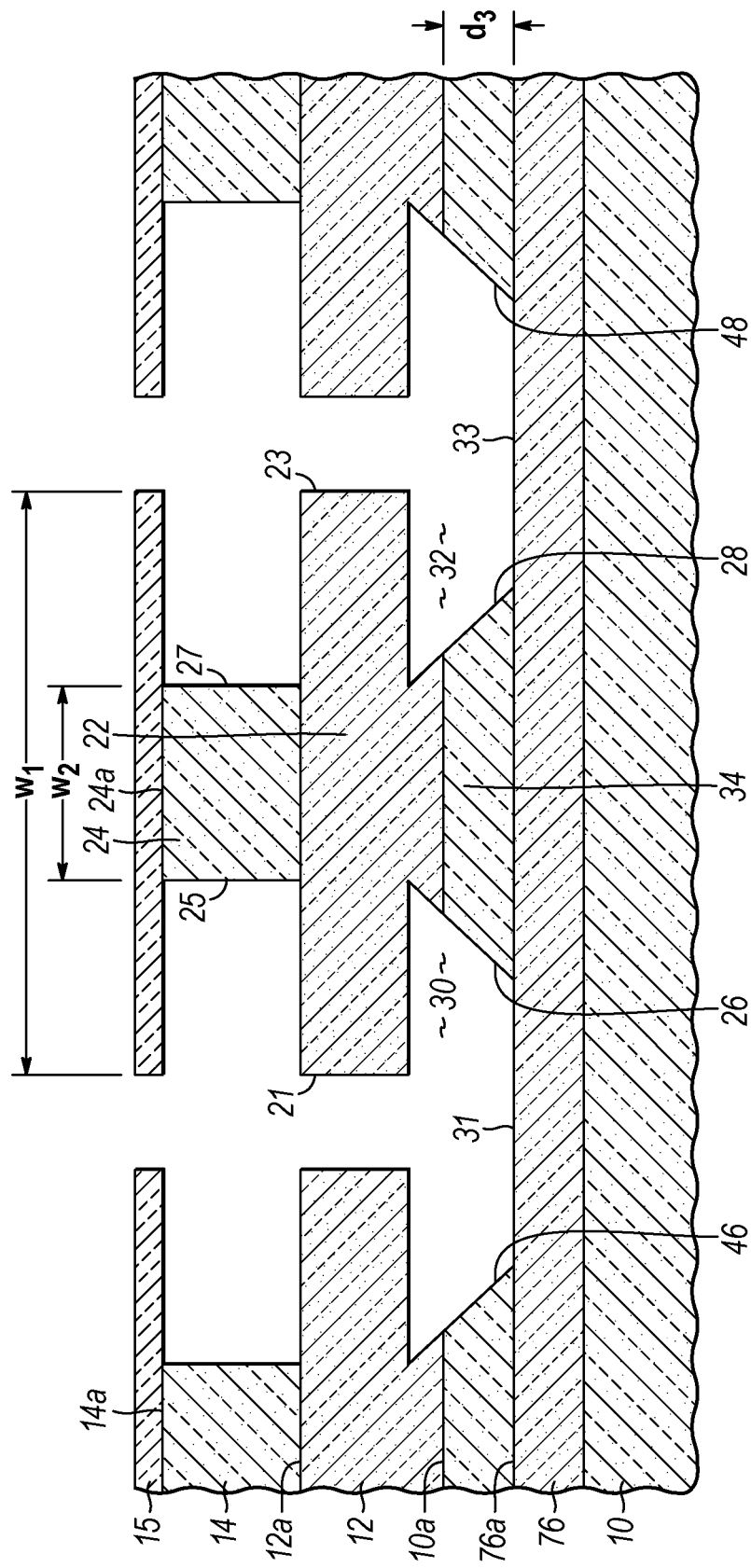
FIG. 6 is a cross-sectional view similar to FIG. 2 of a substrate portion at a fabrication stage of a processing method for fabricating a device structure in accordance with an alternative embodiment of the invention.

With reference to FIG. 6 in which like reference numerals refer to like features in FIG. 2 and in accordance with an alternative embodiment of the processing method, the substrate 10 may include an etch stop layer 76 that is incorporated as a continuous layer into the substrate 10 at least in the vicinity of the collector 34. In one embodiment, the etch stop layer 76 may be comprised of a layer of SiGe that is embedded as a layer of diverse composition in the substrate 10. The etch stop layer 76 may be introduced into the device construction during formation of an epitaxial layer of semiconductor material on the substrate 10 by varying the composition of the epitaxial layer during growth. A top surface 76a of the etch stop layer 76 is positioned at a designated depth, $d_3$, measured relative to the top surface 10a.

The etching process used to form the cavities 30, 32 in the substrate 10 penetrates through the base layer 12 to the shallow depth, $d_1$, into the substrate 10 (FIG. 1) and stops vertically on the etch stop layer 76. For example, if the etch stop layer 76 and the base layer 12 are each comprised of SiGe, then the base layer 12 must be penetrated before the selective etching process can be effective. The portion of the substrate 10 between the etch stop layer 76 and the base layer 12 is etched selective to the etch stop layer 76 to define the cavities 30, 32. The selective etching process may rely on the use of a composition-sensitive etchant that etches the semiconductor material of the portion of the substrate 10 between the etch stop layer 76 and the base layer 12 at a higher rate than the semiconductor material of the etch stop layer 76. The presence of the etch stop layer 76 lends depth control to the etching process to reduce the downward etch into the substrate 10 compared to the lateral etch of the substrate 10 to undercut the base layer 12, and the lateral etch rate may be greater than the vertical etch rate when the cavities 30, 32 are formed. Surfaces 31, 33 are located at a shallower depth beneath the top surface 10a of the substrate 10 than in the absence of the etch stop layer 76. The control over the downward etch may reduce the depth of the collector 34 because the trench isolation regions 66, 68, which conform to the shape of the trenches 18, 20 after the undercut forming cavities 30, 32, are shallower in depth.

Figure 7:
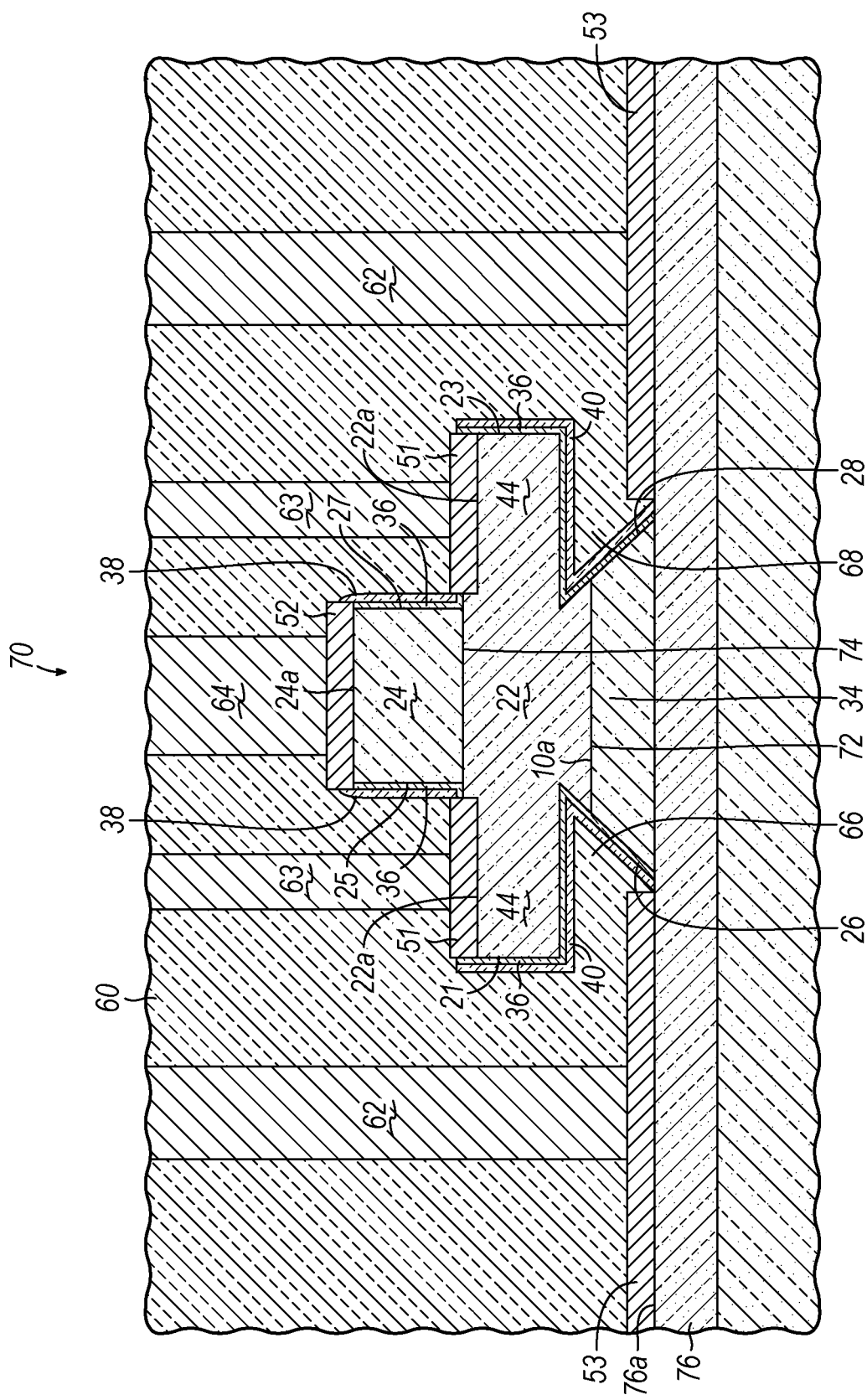
FIG. 7 is a cross-sectional view of the substrate portion of FIG. 6 following additional fabrication stages of the processing method.

With reference to FIG. 7 in which like reference numerals refer to like features in FIG. 6 and at subsequent fabrication stages of the processing method, the process flow continues substantially as described above with regard to FIGS. 3-5. In this embodiment, sections 53 of silicide layer on surfaces 31, 33 may be used to contact the collector 34.

Figure 8:
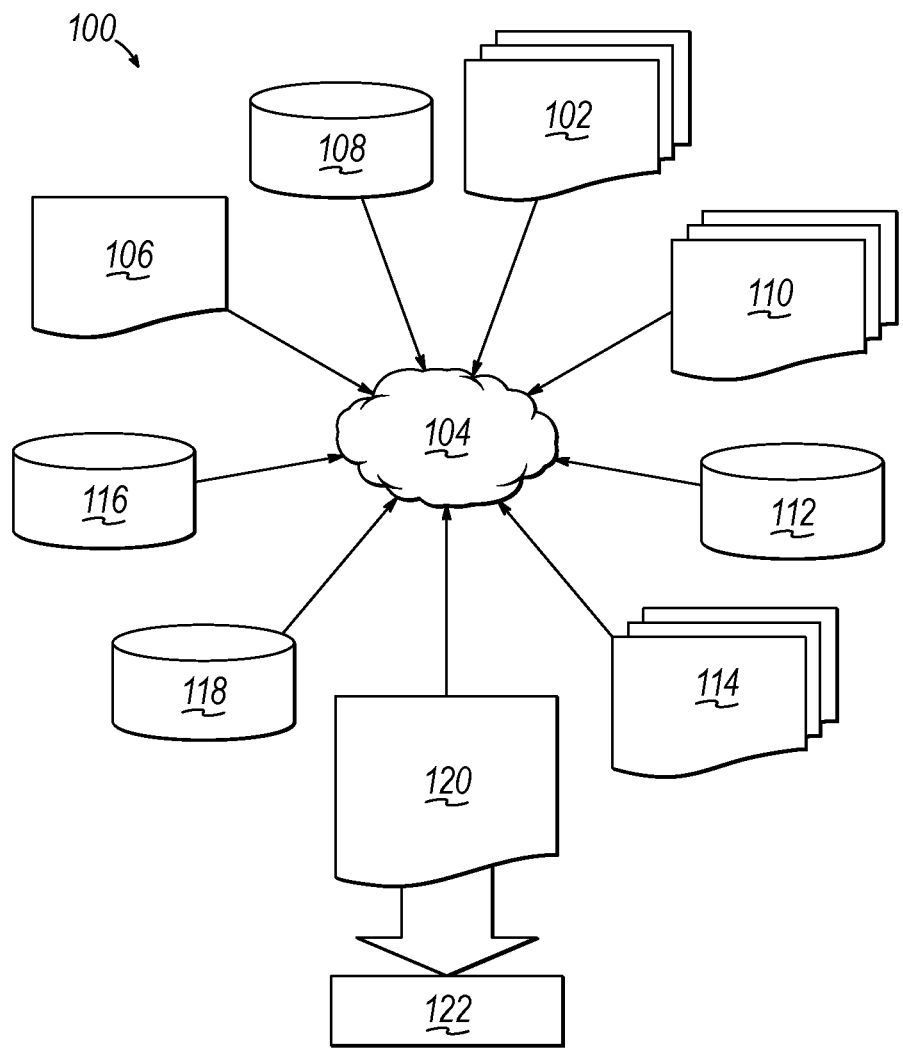
FIG. 8 is a flow diagram of a design process used in semiconductor design, manufacture, and/or test.

FIG. 8 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 1-7. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 1-7. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 1-7 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-7. In one embodiment, design structure 120 may comprise a compiled, executable HDL simulation model that functionally simulates the devices shown in FIGS. 1-7.

Design structure 120 may also employ a data format used for the exchange of layout data of integrated circuits and/or symbolic data format (e.g., information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-7. Design structure 120 may then proceed to a stage 122 where, for example, design structure 120: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a bipolar junction transistor, the method comprising:
    forming a first layer comprised of a first semiconductor material and disposed on a substrate containing a first terminal;
    forming a second layer comprised of a second semiconductor material and disposed on the first layer;
    forming a patterned etch mask on the second layer;
    etching a trench extending through the etch mask, the first layer, and the second layer and into the substrate so as to define a section of the first layer and a section of the second layer stacked with the section of the first layer; and
    etching the substrate and the section of the second layer selectively to the section of the first layer and the etch mask so that the section of the second layer is narrowed relative to the section of the first layer to define a second terminal and a portion of the trench in the substrate is widened to undercut the section of the first layer.

2. The method of claim 1 wherein forming the trench extending through the patterned etch mask, the first layer, and the second layer and into the substrate comprises:
    etching the first layer, the second layer, and the substrate with a first etching process that is selective relative to the etch mask.

3. The method of claim 2 wherein the substrate and the section of the second layer are selectively etched relative to the section of the first layer and the etch mask with a second etching process.

4. The method of claim 3 further comprising:
    before the trench is formed by the first etching process, forming an etch stop layer in the substrate,
    wherein the etch stop layer is configured to etch selective to a portion of the substrate between the etch stop layer and the first layer during the second etching process.

5. The method of claim 1 wherein the substrate includes a first surface that is coextensive with the trench, and further comprising:
    after the substrate and the section of the second layer are etching selectively to the section of the first layer and the etch mask, forming a silicide layer on the first surface of the substrate.

6. The method of claim 5 the substrate includes a second surface that is coextensive with the trench, and further comprising:
    covering the second surface of the substrate with a dielectric layer comprised of a material that prevents silicide formation.

7. The method of claim 6 further comprising:
    masking the section of the first layer and the section of the second layer; and opening a contact area on a top surface of the substrate that is separated from the first surface of the substrate by the removing the first layer and the second layer from the substrate peripheral to the second surface, wherein the contact area is coupled by a doped region extending beneath the trench with the first terminal.

8. The method of claim 5 further comprising:

forming a contact coupled with the silicide layer on the first surface of the substrate.

9. The method of claim 1 wherein the section of the first layer includes an intrinsic base that is coextensive with the first terminal along a junction and an extrinsic base that overhangs the trench, and further comprising:

forming a dielectric layer of a local interconnect structure;

forming a contact extending through the dielectric layer to the extrinsic base; and filling the trench with a dielectric material originating from the dielectric layer to define a trench isolation region located at least in part beneath the extrinsic base.

10. The method of claim 1 wherein the section of the second layer is coextensive with a portion of the first layer along a junction, and further comprising:

forming a dielectric layer of a local interconnect structure;

forming a contact extending through the dielectric layer to the second terminal; and filling the trench with dielectric material from the dielectric layer to define a trench isolation region that extends beneath the first layer.

11. The method of claim 1 further comprising:

masking the section of the first layer and the section of the second layer; and removing the first layer and the second layer from the substrate peripheral to the trench to open a contact area, wherein the contact area is coupled by a doped region extending beneath the trench with the first terminal.

* * * * *